(12) United States Patent
Teo et al.

(10) Patent No.: US 12,533,704 B2
(45) Date of Patent: Jan. 27, 2026

(54) SUBSTRATE CARRIER IMPROVEMENT

(71) Applicant: Applied Materials, Inc., Santa Clara, CA (US)

(72) Inventors: Russell Chin Yee Teo, Palo Alto, CA (US); Yingdong Luo, Newark, CA (US); Ludovic Godet, Sunnyvale, CA (US); Daihua Zhang, Los Altos, CA (US); Zhengping Yao, Cupertino, CA (US); James D. Strassner, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 414 days.

(21) Appl. No.: 18/337,246

(22) Filed: Jun. 19, 2023

(65) Prior Publication Data
US 2024/0001398 A1 Jan. 4, 2024

Related U.S. Application Data

(60) Provisional application No. 63/357,983, filed on Jul. 1, 2022.

(51) Int. Cl.
*B05D 3/00* (2006.01)
*B05C 5/02* (2006.01)
(Continued)

(52) U.S. Cl.
CPC ............ *B05C 5/0291* (2013.01); *B05D 3/007* (2013.01); *B05D 3/067* (2013.01); *B05D 7/24* (2013.01); *B05D 2203/30* (2013.01)

(58) Field of Classification Search
CPC ...... B05C 5/0291; B05D 3/007; B05D 3/067; B05D 7/24; B05D 2203/30; H01L 21/00; H01L 21/6833
See application file for complete search history.

(56) References Cited

U.S. PATENT DOCUMENTS

| 7,223,641 B2 * | 5/2007 | Maekawa ......... H10D 30/6758 257/E29.295 |
| 7,235,415 B2 * | 6/2007 | Mikoshiba ........... B41J 2/14201 257/E21.174 |

(Continued)

FOREIGN PATENT DOCUMENTS

JP        2006-159094 A        6/2006

OTHER PUBLICATIONS

International Search Report dated Oct. 11, 2023 for Application No. PCT/US2023/025668.

*Primary Examiner* — William P Fletcher, III
(74) *Attorney, Agent, or Firm* — Patterson + Sheridan, LLP

(57) ABSTRACT

A method of forming a substrate carrier is provided. The method includes forming a first electrode over a first surface of a substrate, the first electrode arranged in a first pattern including a plurality of segments, wherein portions of the plurality of segments are spaced apart from each other by a plurality of gaps; and dispensing a plurality of droplets of a dielectric material over the substrate and into the plurality of gaps. The plurality of droplets includes a first droplet and a second droplet, the first droplet is dispensed onto a first location over the substrate, the second droplet is dispensed onto a second location over the substrate, a size of the first droplet is at least 10% larger than a size of the second droplet.

20 Claims, 4 Drawing Sheets

(51) Int. Cl.
  *B05D 3/06* (2006.01)
  *B05D 7/24* (2006.01)

(56) References Cited

U.S. PATENT DOCUMENTS

| | | |
|---|---|---|
| 11,094,573 B2 | 8/2021 | Qiao et al. |
| 2005/0098120 A1 | 5/2005 | Maki |
| 2012/0248716 A1 | 10/2012 | Nobori et al. |
| 2017/0098568 A1 | 4/2017 | Cooke |
| 2018/0166311 A1* | 6/2018 | Boyd, Jr. .................. C23C 4/04 |
| 2021/0379594 A1* | 12/2021 | Gong ................ B01L 3/502707 |

* cited by examiner

SUBSTRATE CARRIER IMPROVEMENT

CROSS-REFERENCE TO RELATED APPLICATIONS

This application claims the benefit of U.S. Provisional Patent Application No. 63/357,983, filed on Jul. 1, 2022. The contents of this provisional patent application are herein incorporated by reference.

BACKGROUND

Embodiments of the present disclosure generally relate to substrate carriers. More specifically, embodiments described herein relate to methods of forming substrate carriers.

DESCRIPTION OF THE RELATED ART

Substrate carriers are often used to transport substrates (e.g., semiconductor substrates) between different equipment as different processes are performed on the substrates. The substrate being processed can rest on a surface (e.g., top surface) of the substrate carrier as the substrate is transported to or stored in the different equipment. The substrates being processed are often fragile, so the substrate carrier reduces the amount of stress on the substrate and contact between the substrate and different equipment, such as robotic end-effectors and substrate supports.

Some substrate carriers can include one or more electrodes that can be used to electrostatically clamp the substrate on the substrate carrier during the time period in which the substrate is on the substrate carrier. Generally, a dielectric layer is used to form the top surface of the substrate carrier. The dielectric layer allows the electric field from the electrical charge provided to the electrode of the substrate carrier to be coupled to the substrate, so that the substrate can be electrostatically clamped to the substrate carrier.

Although the dielectric layers conventionally used on substrate carriers can facilitate electrostatically clamping substrates to the substrate carriers, problems remain, such as dielectric layers with portions that can flake off and lead to additional particle generation as well as cracking of the dielectric layer. Accordingly, what is needed are improved substrate carriers and related methods for forming substrate carriers that include dielectric layers that do not lead to particle generation or cracking of the dielectric layer.

SUMMARY

In one embodiment, a method of forming a substrate carrier is provided. The method includes forming a first electrode over a first surface of a substrate, the first electrode arranged in a first pattern including a plurality of segments, wherein portions of the plurality of segments are spaced apart from each other by a plurality of gaps; and dispensing a plurality of droplets of a dielectric material over the substrate and into the plurality of gaps, wherein the plurality of droplets includes a first droplet and a second droplet, the first droplet is dispensed onto a first location over the substrate, the second droplet is dispensed onto a second location over the substrate, a size of the first droplet is at least 10% larger than a size of the second droplet.

In another embodiment, a method of forming a substrate carrier is provided. The method includes forming a first electrode over a first surface of a substrate, the first electrode arranged in a first pattern including a plurality of segments, wherein portions of the plurality of segments are spaced apart from each other by a plurality of gaps; and dispensing a plurality of droplets of a dielectric material over the substrate and into the plurality of gaps, wherein the plurality of droplets includes a first droplet and a second droplet, the first droplet is dispensed onto a first location over the substrate, the second droplet is dispensed onto a second location over the substrate, the first droplet includes a first plurality of dielectric particles, the second droplet includes a second plurality of dielectric particles, an average size of the first plurality of dielectric particles in the first droplet is at least 10% larger than an average size of the second plurality of dielectric particles in the second droplet.

In another embodiment, a method of forming a substrate carrier is provided. The method includes forming a first electrode over a first surface of a substrate, the first electrode arranged in a first pattern including a plurality of segments, wherein portions of the plurality of segments are spaced apart from each other by a plurality of gaps; and dispensing a plurality of droplets over the substrate and into the plurality of gaps to form a dielectric layer, wherein the plurality of droplets includes a first droplet and a second droplet, the first droplet is dispensed onto a first location over the substrate, the second droplet is dispensed onto a second location over the substrate, the first droplet is formed of a first dielectric mixture, and the second droplet is formed of a second dielectric mixture.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate carriers and methods for forming substrate carriers. The substrate carriers can be used to transport substrates (e.g., semiconductor substrates), which are often fragile, between different equipment as the substrates are processed. More specifically, embodiments described herein relate to substrate carriers that can electrostatically clamp a substrate as well as methods for forming the substrate carriers. In some embodiments, the methods can include forming a dielectric layer of the substrate carrier by dispensing droplets of dielectric material over the substrate of the substrate carrier, for example by using an inkjet process. In some embodiments, the dielectric material can include a mixture of dielectric particles (e.g., silicon oxide nanoparticles) and a curing agent, so that the dielectric layer can be cured after the droplets are dispensed. The droplets of the dielectric material can be provided with a high level of precision allowing different amounts, sizes, and/or different types of droplets to be applied at different locations over the substrate of the substrate carrier. This precision allows increased control over the uniformity and dimensions of the dielectric layer being formed compared to conventional processes used to form dielectric layers for substrate carriers, such as chemical vapor deposition (CVD), plasma-enhanced CVD, physical vapor deposition, or a spin-on-coating process.

Figure 1A:
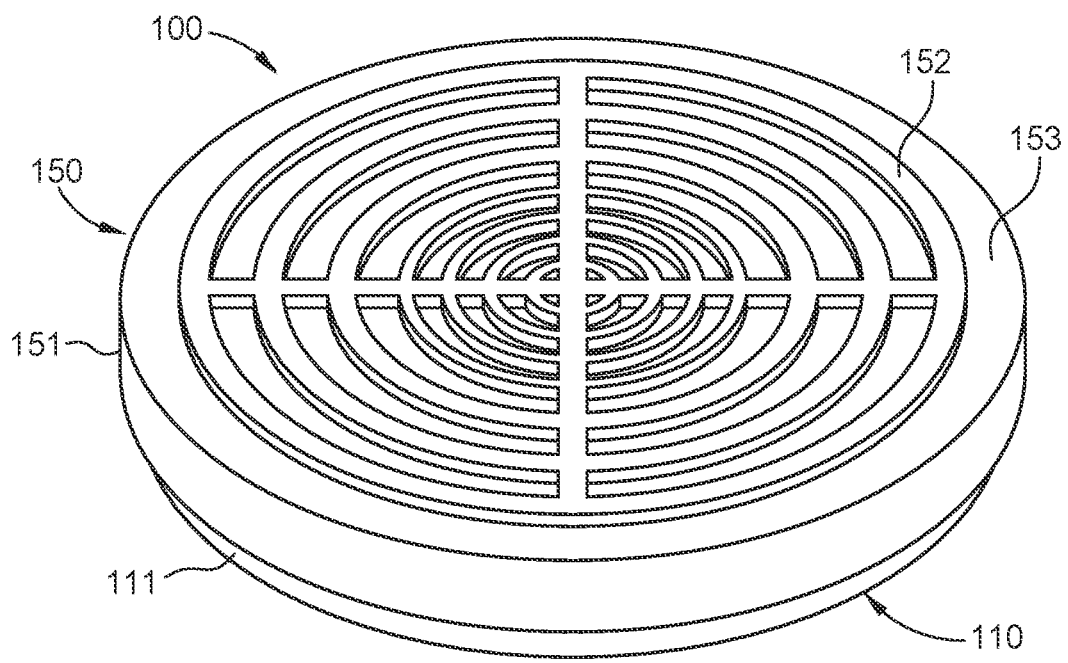
FIG. 1A is a top view of a substrate carrier formed according to a conventional process.
Figure 1B:
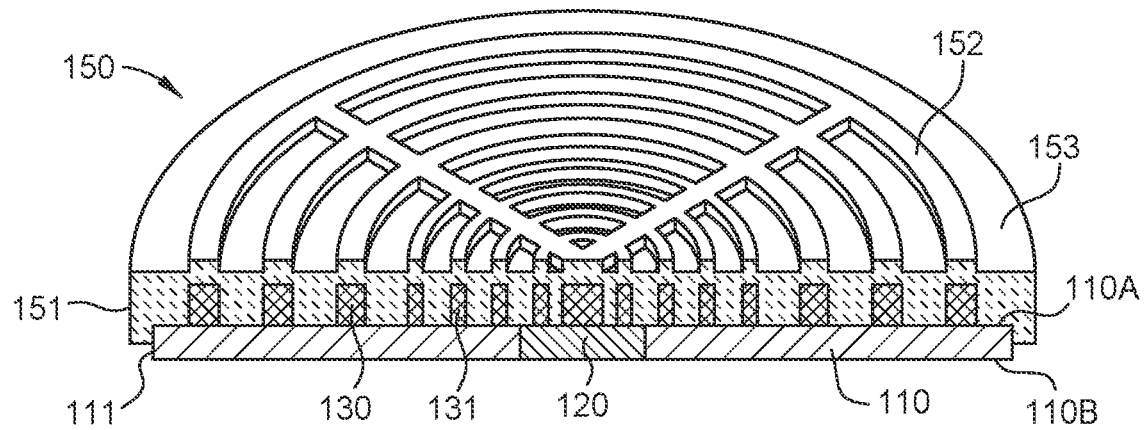
FIG. 1B is a side cross-sectional view of the substrate carrier of FIG. 1A.

FIG. 1A is a top view of a substrate carrier 100 formed according to a conventional process. FIG. 1B is a side cross-sectional view of the substrate carrier 100.

The substrate carrier 100 includes a substrate 110, an electrical contact 120, an electrode 130, and a dielectric layer 150. The substrate 110 can include a first surface 110A and a second surface 110B. The electrical contact 120 is positioned within an opening in the substrate 110. The electrode 130 and the dielectric layer 150 are formed over the first surface 110A of the substrate 110. The substrate 110 can be formed of silicon, glass, a ceramic material, or a metallic material. The contact 120 is formed of a conductive material, such as tungsten or aluminum.

The electrode 130 can be formed of a conductive material, such as titanium nitride. Some other materials that can be used for the electrode 130 can include copper, manganese, cobalt, aluminum, ruthenium, titanium, carbon as well as other conductive or semiconductive materials.

The electrode 130 includes a plurality of conductive segments 131 that are all electrically connected to each other and can be arranged in a pattern. An example of a ring-shaped pattern of the conductive segments 131 is shown in FIG. 2C. The electrode 130 is electrically connected to the contact 120. The plurality of conductive segments 131 can be used to distribute an electrical charge across the substrate carrier 100 when an electrical voltage is applied to the electrical contact 120. The electrical charge can remain distributed across the conductive segments 131 for long durations (e.g., hours or days) after the voltage source is removed from the contact 120. The distributed electrical charge can be used to clamp a substrate (not shown) on the substrate carrier 100. The substrate can remain clamped on the substrate carrier 100 as long as the electrode 130 remains charged.

The dielectric layer 150 generally includes a dielectric material, such as an oxide (e.g., silicon oxide), a nitride (e.g., silicon nitride), or rubber. The dielectric layer 150 is generally formed using a spin-on-coating process or a deposition process, such as chemical vapor deposition or physical vapor deposition. Although these processes can be used for forming the dielectric layer 150, these processes result in a nonplanar top surface 153 of the dielectric layer 150 and an edge 151 of the dielectric layer 150 that overhangs an edge 111 of the substrate 110.

The nonplanar top surface 153 of the dielectric layer 150 can include a plurality of elevated portions 152 that overlie the plurality of conductive segments 131 of the electrode 130. The plurality of elevated portions 152 are raised relative to other portions of the top surface 153 of the dielectric layer 150. The elevated portions 152 of the dielectric layer 150 can reduce the electrostatic clamping force of the substrate carrier 100 when an electrical charge is provided to the electrode 130 due to the increased distance between the substrate (not shown) and the non-elevated portions of the top surface 153 of the dielectric layer 150. A planarization process (e.g., chemical mechanical polishing (CMP)) or an etching process can be performed to remove the elevated portions 152 to increase the electrostatic clamping force of the substrate carrier 100. However, these additional processes can be costly and time-consuming, and thus should be avoided if possible.

The edge 151 of the dielectric layer 150 overhangs the edge 111 of the substrate 110. This overhang of the edge 151 can lead to flaking and particle generation by the substrate carrier 100, which can lead to reduced product yield and increased downtime for cleaning procedures to remove the particles. The overhanging edge 151 is also more prone to cracking and scratching, which can reduce the useful life of the substrate carrier 100. To address these problems associated with the substrate carrier 100, a new substrate carrier 200 as described below is proposed.

Figure 2A:
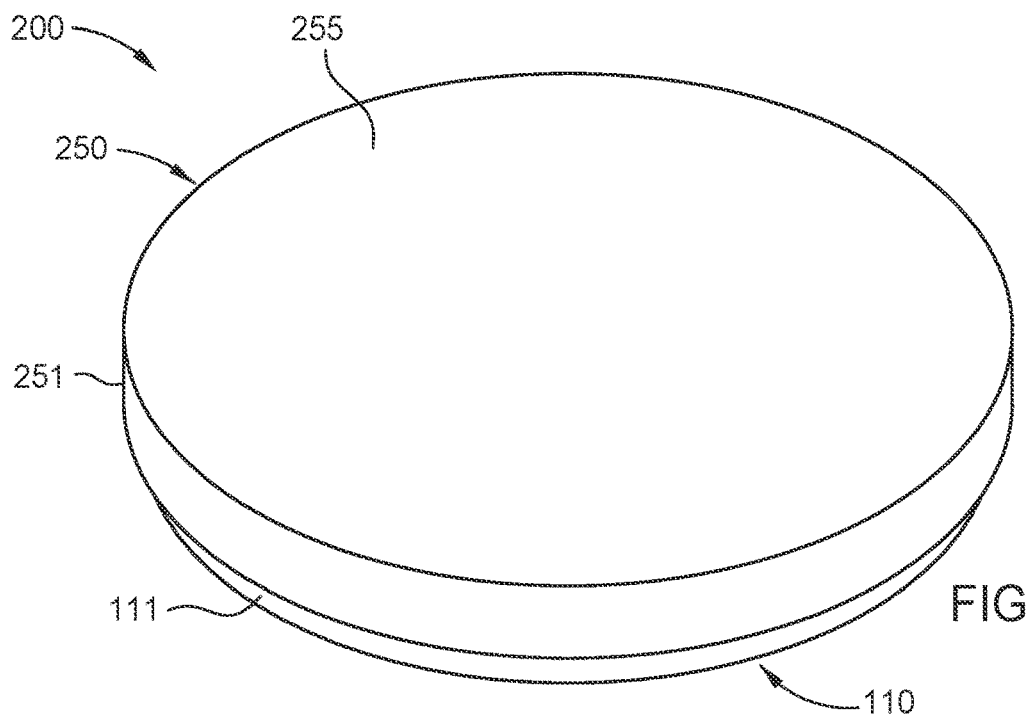
FIG. 2A is a top view of a substrate carrier, according to one embodiment.
Figure 2B:
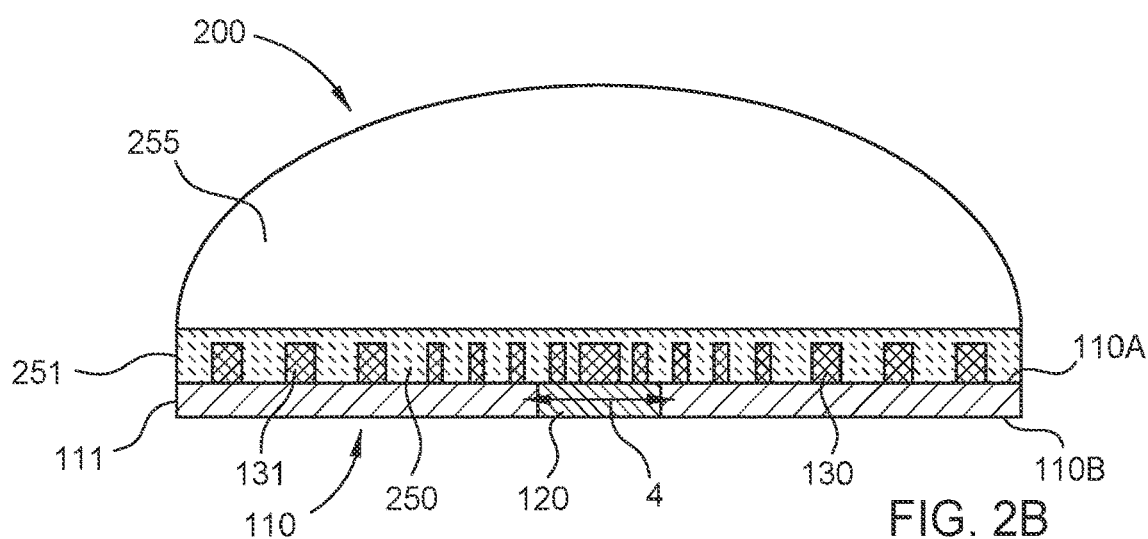
FIG. 2B is a side cross-sectional view of the substrate carrier, according to one embodiment.
Figure 2C:
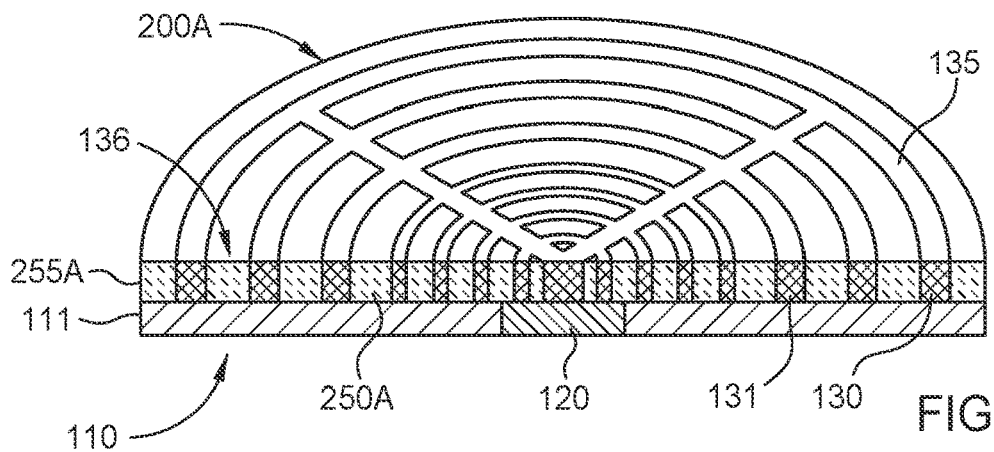
FIG. 2C is a side cross-sectional view of an alternative substrate carrier, according to one embodiment.

FIG. 2A is a top view of a substrate carrier 200, according to one embodiment. FIG. 2B is a side cross-sectional view of the substrate carrier 200, according to one embodiment.

The substrate carrier 200 is similar to the substrate carrier 100 described above except that the substrate carrier 200 includes a dielectric layer 250 that is different than the dielectric layer 150 of the substrate carrier 100. The dielectric layer 250 can be formed by a process (e.g., an inkjet process) that dispenses a plurality of droplets of dielectric material over the substrate 110 as well as between and over the conductive segments 131 of the electrode 130. The plurality of droplets of dielectric material can be dispensed over the substrate 110 with high precision allowing the dielectric layer 250 to be formed within targeted dimensions without requiring any additional removal processes, such as CMP or an etching process. This high level of precision enables an edge 251 of the dielectric layer 250 to be aligned with the edge 111 of the substrate 110, which prevents the problems described above associated with the overhanging edge 151 from occurring, such as cracking, scratching, flaking and particle generation. Additionally, due to the high level of precision, the dielectric layer 250 does not include the elevated portions 152 of the dielectric layer 150 described above. For example, a top surface 255 of the dielectric layer 250 is shown as substantially flat. Used herein, substantially flat can refer to a surface that varies in elevation from 0.5 nm to about 500 micron, such as from about 1 nm to about 100 micron.

The dielectric layer 250 can be formed with the edge 251 aligned with the edge 111 of the substrate and without the elevated portions 152 of the dielectric layer 150 because the dielectric layer 250 is formed using a process, such as an inkjet printing process, that varies how the material of the dielectric layer 250 is provided over different portions of the substrate 110. For example, when an inkjet printing process is used, the quantity of droplets, the size of droplets, the size of dielectric particles in the droplets, the distance between consecutive droplets (also referred to as pitch), the shape of the droplets, and/or the materials included in the droplets can be varied across the substrate 110 or from substrate to substrate. In some embodiments, the quantity of similarly sized droplets, the size of droplets, the size of dielectric particles inside the droplets, and/or materials included in the droplets can be varied for the gaps between the conductive segments 131 relative to the droplets dispensed over areas directly overlying the conductive segments 131 or for areas near the edge 111 of the substrate 110.

FIG. 2C is a side cross-sectional view of an alternative substrate carrier 200A, according to one embodiment. The substrate carrier 200A is the same as the substrate carrier 200 described above except that the substrate carrier 200A includes a dielectric layer 250A that is different than the dielectric layer 250 included in the substrate carrier 200. The dielectric layer 250A includes a top surface 255A that is at a same elevation as a top surface 135 of the conductive segments 131 of the electrode 130. Thus, the top surface 135 of the conductive segments 131 can be exposed when a substrate (not shown) is clamped to the substrate carrier 200A. Forming the substrate carrier 200A would not be possible using conventional techniques (e.g., CVD, PVD, or spin-on-coating processes) for forming the dielectric layer of a substrate carrier without removal of a large amount of dielectric material down to the top surface 135 of the conductive segments 131.

Figure 3:
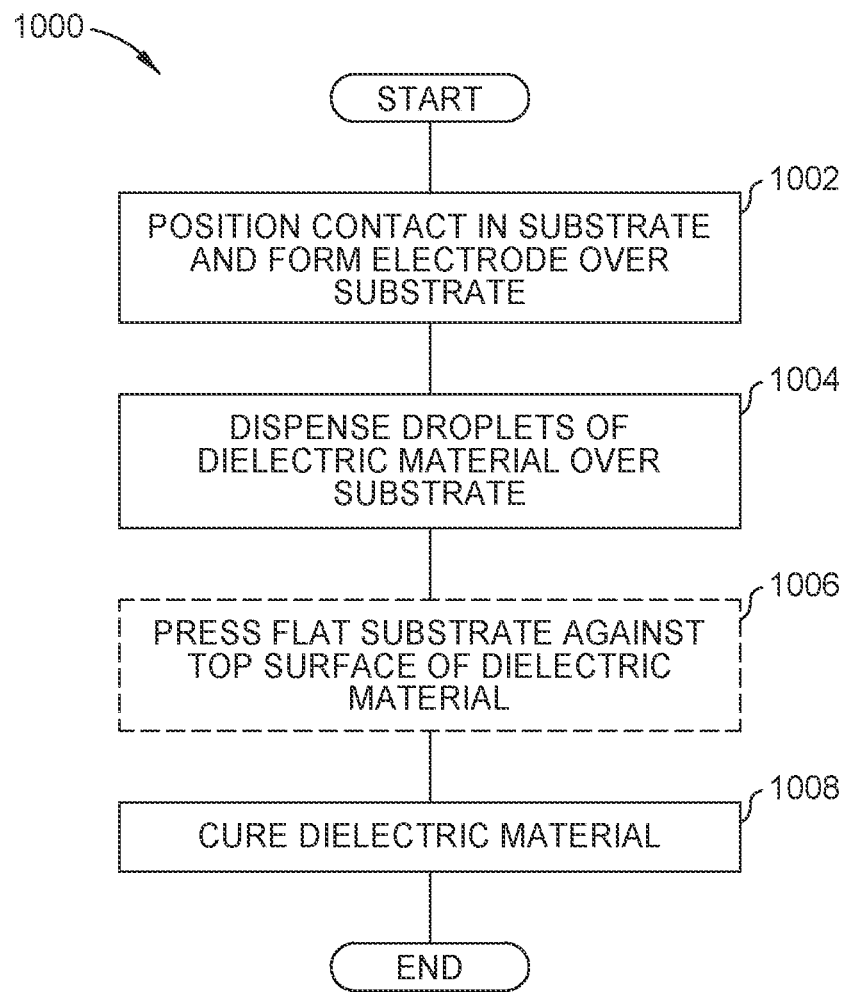
FIG. 3 is a process flow diagram of a method of forming the substrate carrier shown in FIGS. 2A and 2B, according to one embodiment.
Figure 4A:
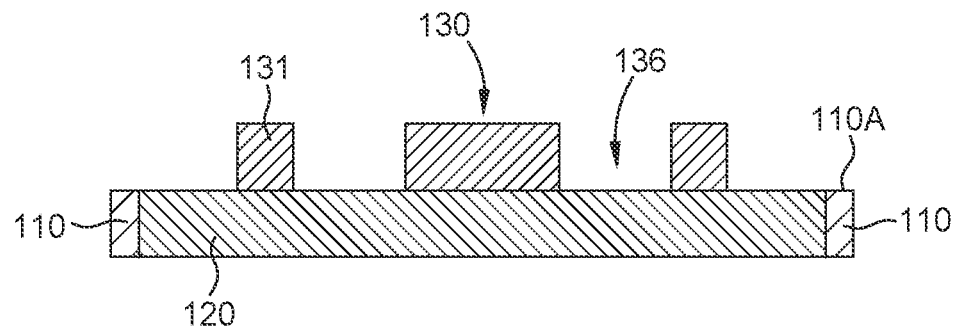
FIGS. 4A-4C show partial cross-sectional views of the substrate carrier of FIGS. 2A and 2B at different stages of the method of FIG. 3, according to one embodiment.
Figure 4B:
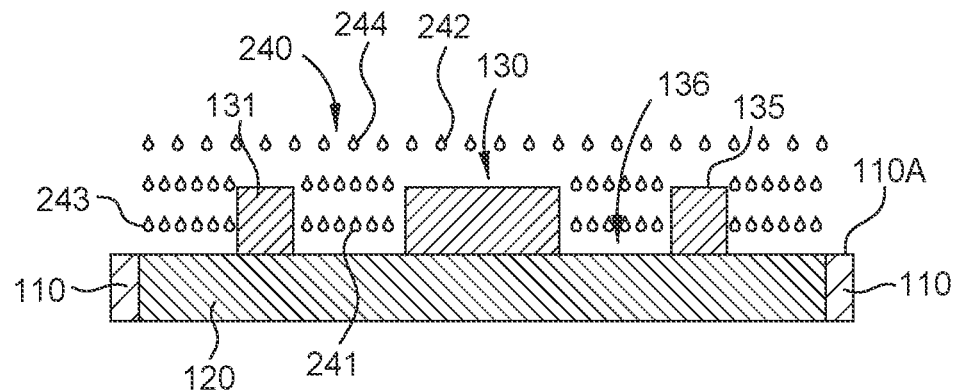
Figure 4C:
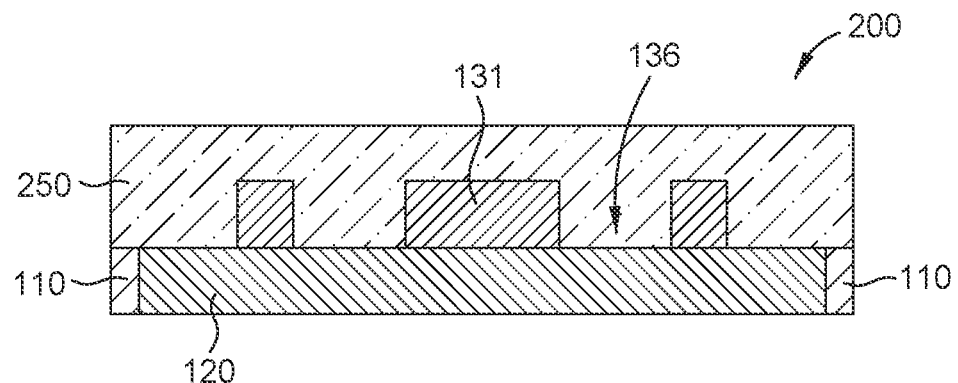

FIG. 3 is a process flow diagram of a method 1000 of forming the substrate carrier 200 shown in FIGS. 2A and 2B, according to one embodiment. FIGS. 4A-4C show partial cross-sectional views of the substrate carrier 200 at different stages of the method 1000, according to one embodiment. The views in FIGS. 4A-4C are taken along section line 4 from FIG. 2B. The method 1000 begins at block 1002.

At block 1002, with reference to FIG. 4A, the contact 120 is positioned in the substrate 110, and the electrode 130 is formed over the substrate 110. In some embodiments, the contact 120 can be positioned in an opening in the substrate 110 and attached to the substrate 110 using a soldering, brazing, or adhesive process. The electrode 130 can be formed over the substrate 110 using a PVD process, such as a PVD process using a mask to control the deposition of the material used to form the electrode 130. The electrode 130 can be formed of the conductive segments 131. Portions of the conductive segments 131 of the electrode 130 can be spaced apart from each other by a plurality of gaps 136. The spacing apart of different portions of the conductive segments 131 is also shown in the top view of the substrate carrier 200A in FIG. 2C.

At block 1004, with reference to FIG. 4B, a plurality of droplets of dielectric material 240 are dispensed over the substrate 110. The plurality of droplets of dielectric material 240 can be dispensed over the substrate 110, over the contact 120, over the conductive segments 131, and into the gaps 136 between the conductive segments 131. Although the droplets of dielectric material 240 are shown as being dispensed simultaneously over the entire portion of the substrate carrier shown in FIG. 4B, this is for ease of illustration only, and in many instances the droplets of dielectric material 240 can be dispensed in a slower manner, such as one droplet at a time.

The dielectric material 240 can be a mixture that includes a plurality of components, such as dielectric particles, one or more curing agents, one or more solvents as wells as one or more binders or other additives.

In some embodiments, the dielectric particles can include dielectric nanoparticles (i.e., particles having a size from about 1 nm to about 100 nm) or larger dielectric particles, such as particles having a size from about 100 nm to about 10 micron, such as from about 500 nm to about 1 micron, but in some embodiments smaller (e.g., 0.5 nm) or even larger dielectric particles (e.g., 20 micron) can also be used. The dielectric particles in the droplets can be formed of one or more dielectric materials, such as silicon oxide, titanium oxide, zinc oxide, zirconium oxide, niobium oxide, hafnium oxide, vanadium oxide, lead oxide, tantalum oxide, and rubber.

In some embodiments, the dielectric material 240 can include one or more curing agents, such as an ultraviolet curing agent or other radiation-sensitive curing agent, a thermal curing agent, or a chemical curing agent. Some additional materials in the dielectric material 240 can include acrylate or methacrylate monomers, photoinitiators, epoxy, polymers (e.g., polydimethylsiloxane, polystyrene, polyether, polyester, polycarbonate, polyurethane, and derivatives of each), or curing agents, such as an amine, anhydride, thiol, amide, or urea-based curing agent or a photoacid generator curing agent.

Solvents in the dielectric material 240 can include but are not limited to an alcohol, ester, ether, or siloxane solvent. Additives in the dielectric material 240 can include additives for adjusting the surface tension or viscosity of the dielectric material 240, which is dispensed from a nozzle or other component using inkjet equipment (not shown).

In FIG. 4B, four individual droplets 241-244 of dielectric material 240 are identified. Each of the locations on which the droplets are dispensed can be referred to as a location over the substrate 110. A first droplet 241 can be dispensed onto the electrical contact 120 in one of the plurality of gaps 136. A second droplet 242 is dispensed onto one of the conductive segments 131 of the electrode 130. A third droplet 243 is dispensed onto the first surface 110A of the substrate 110. A fourth droplet 244 is dispensed onto a last row of dielectric material 240. The material of the fourth droplet 244 can form a top surface of the dielectric layer 250. Although the droplets 241-244 are shown as identical, this is for ease of illustration, and the droplets 241-244 can be different from each other as described below. Droplets dispensed over locations that only spaced apart horizontally, such as droplets 241, 243 or droplets 244, 242 can be different in all of the ways described below. Furthermore, droplets dispensed over locations that directly underlie of overlie each other, such as droplets 241, 244 can also be different from each other in all of the ways described below.

The dispensing of the dielectric material can vary over different portions of the substrate 110. For example, a higher quantity (e.g., 1% more, 10% more, 50%, 100% more, etc.) of droplets of dielectric material 240 can be provided into the gaps 136 between the conductive segments 131 than the quantity of droplets provided over areas directly overlying the conductive segments 131. The quantity of droplets can vary in a horizontal direction (i.e., parallel to the first surface 110A of the substrate 110) or in a vertical direction (i.e., perpendicular to the first surface 110A of the substrate 110, which is also referred to as the thickness direction of the dielectric layer being formed). In one embodiment, a higher quantity of smaller droplets can be used for the top row of droplets to increase the likelihood of obtaining the flat top surface 255 of the dielectric layer 250.

In some embodiments, the size of droplets can vary over different portions of the substrate 110. For example, in one embodiment, droplets having a larger droplet volume (e.g., 1% larger, 10% larger, 50% larger, 100% larger, 1000% larger, etc.) can be provided on the areas directly overlying the conductive segments 131 (e.g., droplet 242) compared to the size of droplets dispensed in the gaps 136 (e.g., droplet 241) or vice versa. Furthermore, the size of droplets can vary in a thickness direction of the dielectric layer being formed from the droplets of dielectric material 240. For example, smaller droplets can be used in the gaps 136 (e.g., droplet 241) compared to the larger size (e.g., 1% larger, 10% larger, 50% larger, 100% larger, 1000% larger, etc.) of droplets overlying the gaps 136 (e.g., droplet 244), but at an elevation above the top surface 135 of the conductive segments 131. In another embodiment, smaller droplets can be used for the droplets that form the top row of the dielectric layer 250 (e.g., droplets 242 and 244) to increase the likelihood of obtaining a flat top surface of the dielectric layer 250. Smaller droplets can also be used for the droplets that are dispensed in areas near the edge 111 of the substrate 110 (e.g., droplet 243) to increase the likelihood of obtaining the edge 251 of the dielectric layer 250 that is aligned with the edge 111 of the substrate 110. In some embodiments, smaller droplets with a reduced pitch (i.e., horizontal distance between neighboring droplets) can be used to form the outer edge 251 of the dielectric layer 250 and the top surface 255 of the dielectric layer.

In some embodiments, an average size (e.g., a volume, an area, or a length) of the dielectric particles (e.g., nanoparticles) in the droplets of dielectric material 240 dispensed over a first location of the substrate 110 can be larger (e.g., at least 1% larger, 10% larger, 50% larger, 100% larger, 1000% larger, etc.) than an average size of particles dispensed over a second location of the substrate 110. In some embodiments, the size of dielectric particles in the droplets can be varied for the same reasons provided above for the size (e.g., volume) of the droplets, including but not limited to using smaller dielectric particles for the droplets forming the top surface or edge of the dielectric layer 250 relative to the size of the dielectric particles in the other droplets.

In some embodiments, the components in the mixture that forms the dielectric material can vary across different locations over the substrate 110 or at different thickness locations over the substrate. In one embodiment, dielectric particles formed of a first material are dispensed first at locations near the substrate 110 while dielectric particles formed of a second material are dispensed at locations closer to the top surface of the dielectric layer 250 being formed. In another embodiment, the dielectric particles and/or other material(s) can be modified (e.g., the viscosity of the droplets is modified) for droplets near the top surface (e.g., droplet 244) or edge (e.g., droplet 243) of the dielectric layer 250 relative to droplets away from these locations (e.g., droplet 241) to increase the likelihood of obtaining the flat top surface 255 of the dielectric layer 250 and to increase the likelihood of obtaining the edge 251 of the dielectric layer 250 that is aligned with the edge 111 of the substrate 110.

At block 1006, a flat object, such as flat substrate can optionally be pressed against the dielectric material 240 before the dielectric material is cured to further improve the flatness of the top surface 255 of the dielectric layer 250.

At block 1008, the dielectric material 240 is cured to form the dielectric layer 250. The curing process depends on the curing agent used in the dielectric material. For example, the curing process can include an ultraviolet curing process, a thermal curing process, or a chemical curing process. In some embodiments, the droplets having any of the differences described above (e.g., size, size of particles in the droplets, materials in the droplets) can be cured simultaneously.

After the curing process, no additional removal processes, such as a CMP or etching process are needed, for example to remove the elevated portions 152 of the substrate carrier 100 shown in FIG. 1A because the substrate carrier 200 does not include these elevated portions. Furthermore, the inkjet process described above also prevents an overhang, such as the overhanging edge 151 of the substrate carrier 100 shown in FIG. 1B, from being formed, which enables the problems associated with the overhanging edge 151 to be avoided, such as cracking, flaking, scratching, and particle generation.

While the foregoing is directed to examples of the present disclosure, other and further examples of the disclosure may be devised without departing from the basic scope thereof, and the scope thereof is determined by the claims that follow.

What is claimed is:

1. A method of forming a substrate carrier comprising:
   forming a first electrode over a first surface of a substrate, the first electrode arranged in a first pattern including a plurality of segments, wherein portions of the plurality of segments are spaced apart from each other by a plurality of gaps; and
   dispensing a plurality of droplets of a dielectric material over the substrate and into the plurality of gaps, wherein
      the plurality of droplets includes a first droplet and a second droplet,
      the first droplet is dispensed onto a first location over the substrate,
      the second droplet is dispensed onto a second location over the substrate, and
      a size of the first droplet is at least 10% larger than a size of the second droplet.

2. The method of claim 1, wherein the first location over the substrate is spaced apart from the second location over the substrate in a direction that is parallel to the first surface of the substrate.

3. The method of claim 1, wherein the first location over the substrate directly overlies or directly underlies the second location over the substrate.

4. The method of claim 1, wherein each droplet of the dielectric material includes a plurality of dielectric nanoparticles.

5. The method of claim 4, wherein the plurality of dielectric nanoparticles includes one or more nanoparticles formed of silicon oxide, titanium oxide, zinc oxide, zirconium oxide, niobium oxide, hafnium oxide, vanadium oxide, lead oxide, tantalum oxide, and rubber.

6. The method of claim 1, wherein the size of the first droplet is at least 50% larger than the size of the second droplet.

7. The method of claim 1, further comprising curing the dielectric material.

8. A method of forming a substrate carrier comprising:
   forming a first electrode over a first surface of a substrate, the first electrode arranged in a first pattern including a plurality of segments, wherein portions of the plurality of segments are spaced apart from each other by a plurality of gaps; and
   dispensing a plurality of droplets of a dielectric material over the substrate and into the plurality of gaps, wherein
      the plurality of droplets includes a first droplet and a second droplet,
      the first droplet is dispensed onto a first location over the substrate,
      the second droplet is dispensed onto a second location over the substrate,
      the first droplet includes a first plurality of dielectric particles,
      the second droplet includes a second plurality of dielectric particles, and an average size of the first plurality of dielectric particles in the first droplet is at least 10% larger than an average size of the second plurality of dielectric particles in the second droplet.

9. The method of claim 8, wherein the first location over the substrate is spaced apart from the second location over the substrate in a direction that is parallel to the first surface of the substrate.

10. The method of claim 8, wherein the first location over the substrate directly overlies or directly underlies the second location over the substrate.

11. The method of claim 8, wherein the first and second plurality of dielectric particles each include one or more dielectric nanoparticles formed of silicon oxide, titanium oxide, zinc oxide, zirconium oxide, niobium oxide, hafnium oxide, vanadium oxide, lead oxide, tantalum oxide, and rubber.

12. The method of claim 8, wherein the average size of the first plurality of dielectric particles in the first droplet is at least 50% larger than the average size of the second plurality of dielectric particles in the second droplet.

13. The method of claim 8, further comprising curing the dielectric material.

14. A method of forming a substrate carrier comprising:
forming a first electrode over a first surface of a substrate, the first electrode arranged in a first pattern including a plurality of segments, wherein portions of the plurality of segments are spaced apart from each other by a plurality of gaps; and
dispensing a plurality of droplets over the substrate and into the plurality of gaps to form a dielectric layer, wherein
the plurality of droplets includes a first droplet and a second droplet,
the first droplet is dispensed onto a first location over the substrate,
the second droplet is dispensed onto a second location over the substrate,
the first droplet is formed of a first dielectric mixture, and
the second droplet is formed of a second dielectric mixture.

15. The method of claim 14, wherein
the first dielectric mixture includes a first plurality of dielectric nanoparticles formed of a first dielectric material, and
the second dielectric mixture includes a second plurality of dielectric nanoparticles formed of a second dielectric material.

16. The method of claim 15, wherein a size of the first droplet is at least 50% larger than a size of the second droplet.

17. The method of claim 15, an average size of the first plurality of dielectric nanoparticles in the first droplet is at least 50% larger than an average size of the second plurality of nanodielectric particles in the second droplet.

18. The method of claim 14, wherein the first location over the substrate is spaced apart from the second location over the substrate in a direction that is parallel to the first surface of the substrate.

19. The method of claim 14, wherein the first location over the substrate directly overlies or directly underlies the second location over the substrate.

20. The method of claim 14, further comprising curing the first droplet and the second droplet simultaneously.

* * * * *